United States Patent
Cross

(10) Patent No.: US 6,513,130 B1
(45) Date of Patent: Jan. 28, 2003

(54) CIRCUITS, SYSTEMS, AND METHODS FOR ACCOUNTING FOR DEFECTIVE CELLS IN A MEMORY DEVICE

(75) Inventor: Randolph A. Cross, Poway, CA (US)

(73) Assignee: Cirrus Logic, Inc., Austin ( * ) Notice: Subject to any disclaimer, the term of this patent is extended or adjusted under 35 U.S.C. 154(b) by 1112 days.

(21) Appl. No.: 08/726,568

(22) Filed: Oct. 4, 1996

Related U.S. Application Data

(63) Continuation of application No. 08/340,163, filed on Nov. 15, 1994, now abandoned.

(51) Int. Cl.$^7$ ................................................ G06F 11/00
(52) U.S. Cl. ................................................ 714/6; 714/8
(58) Field of Search .................. 395/182.03, 182.06, 395/183.05, 183.18, 182.05; 365/200, 201; 321/10.2, 10.3; 714/7, 6, 5, 4, 3, 8

(56) References Cited

U.S. PATENT DOCUMENTS

| | | | | |
|---|---|---|---|---|
| 4,141,081 A | * | 2/1979 | Horne et al. | |
| 4,188,670 A | * | 2/1980 | Hsia | |
| 4,398,248 A | * | 8/1983 | Hsia et al. | 364/200 |
| 4,577,294 A | * | 3/1986 | Brown et al. | 365/200 |
| 4,654,830 A | * | 3/1987 | Chua et al. | 365/210 |
| 4,783,781 A | | 11/1988 | Awaya | 371/10 |
| 5,218,572 A | * | 6/1993 | Lee et al. | 365/210 |
| 5,278,793 A | * | 1/1994 | Yeh | 371/10.2 |
| 5,285,417 A | | 2/1994 | Maeda | 365/200 |
| 5,377,146 A | * | 12/1994 | Reddy et al. | 365/200 |
| 5,416,740 A | * | 5/1995 | Fujita et al. | 365/201 |
| 5,442,588 A | * | 8/1995 | Rumas | 365/230.03 |

* cited by examiner

Primary Examiner—Norman M. Wright
(74) Attorney, Agent, or Firm—James J. Murphy, Esq.; Winstead Sechrest & Minick, P.C.

(57) ABSTRACT

A data processing system 100 is provided which includes a memory 104, an array 204 of memory cells arranged in rows and columns, each row being addressable by an address. Address generation circuitry 201/202 is provided for generating ones of the addresses for accessing selected ones of the rows in the array 204. An associative memory 203 is coupled to the address generation circuitry 201/202 for translating a first address, received from the address generation circuitry 201/202 and addressing a defective one of the rows of the array 204, into a second address addressing an operative one of the rows in array 204, the second address being sent to the memory.

23 Claims, 3 Drawing Sheets

CIRCUITS, SYSTEMS, AND METHODS FOR ACCOUNTING FOR DEFECTIVE CELLS IN A MEMORY DEVICE

This is a continuation, of application Ser. No. 08/340,163 filed Nov. 15, 1994, now abandoned.

TECHNICAL FIELD OF THE INVENTION

The present invention relates in general to electronic memories and in particular to circuits, systems and methods for accounting for defective cells in a memory device.

BACKGROUND OF THE INVENTION

When integrating two or more blocks of circuitry into a single integrated circuit, one of the primary areas of concern is achieving a high integrated yield (i.e., the fabrication yield of the entire integrated circuit). Integrated yield becomes a particular concern when the blocks of circuitry being integrated are of different yielding designs and/or must be fabricated under different process rules. Since the integrated yield of a particular integrated circuit is a function of each of the non-integrated yields (i.e., the respective yields of each of the various types of circuitry blocks), it becomes important to maximize the yield of each type of circuitry being fabricated on the chip.

One specific case where integrated yield becomes a significant factor is when dynamic random access memory (DRAM) circuitry is being integrated with logic circuitry into a single chip. First, differences in yield between the logic circuitry and the DRAM circuitry result from differences in the actual designs of the circuits themselves. Second, differences in yields between the two type of circuits arise from the fact that logic circuitry and DRAM circuitry are typically fabricated using substantially different processes.

One way to increase the overall yield of integrated circuits including both logic circuitry and DRAM circuitry is to increase the yield of the DRAM circuitry by "repairing" defective memory cells in the DRAM cell array. Typically, a DRAM memory device has as many as 10% more "extra" rows of memory cells than specified. During production, a wafer test is performed to identify any rows which contain any defective cells. Any rows which are found to contain at least one defective cell are then "replaced" with an operative row taken from the extra rows in the array. This replacement may be performed for example by blowing fuses or otherwise physically altering the circuitry. This technique disadvantageously requires several production steps, including the time consuming steps of testing each cell array and replacing the bad rows with good rows by physically altering the chip. In sum, while such a technique can significantly increase the yield of a DRAM memory array, and hence the integrated yield of the chip, it also disadvantageously increases production time and device cost. At some point, depending on the number of defects, the time and expense required to repair a given memory array may become too time-consuming and/or too expensive and the device is simply discarded.

Thus, the need has arisen for circuits and methods which allow for increased yields of DRAM devices. In particular, such circuits and methods would increase integrated yields for integrated circuits including both logic and DRAM circuitry by increasing the yield of the DRAM memory array. Advantageously, such circuits and methods would help eliminate the time and expense currently required to physically alter the chip to replace bad rows of cells with good rows of cells.

SUMMARY OF THE INVENTION

According to the principles of the present invention, an associative memory system is used to "work around" bad rows and/or columns of cells in a memory cell array. For example, when an address is generated which calls for the access of a defective row of cells in a memory cell array, that address is translated to an address corresponding to a operative row of cells in the array. In a similar fashion, defective columns of cells in the memory array can be effectively "substituted" by directing any request to access such defective columns to operative columns in the same array. In the preferred embodiments, the associative memory is formed on the same integrated circuit as the memory array along with circuitry for testing the array for the existence of defective cells and programming circuitry to program the associative memory.

According to a first embodiment of the present invention, a data processing system is provided which includes an array of memory cells arranged in rows and columns, each row addressable by an address. Address generation circuitry is provided for generating addresses for accessing corresponding rows. An associative memory is coupled to the address generation circuitry for translating a first address, received from the address generation circuitry and addressing a defective one of the rows, into a second address addressing an operative one of the rows, the second address being sent to the memory.

According to a second embodiment of the present invention, a data processing system is provided which includes a controller for having address generation circuitry for generating addresses to access an associated memory. A memory system is provided which includes an array of memory cells arranged in rows and columns and decoding circuitry for selecting ones of the rows and columns in response to received ones of the addresses. The data processing system further includes associative memory circuitry operable to translate addresses received from the controller and addressing defective ones of the rows in a first space in the array into addresses addressing corresponding operative ones of the rows in a second space of the array.

According to a third embodiment of the present invention, a processing system is provided which includes a memory having an array of memory cells arranged in rows and columns, each column addressable by a column address. Address generation circuitry is also included for generating ones of the addresses for accessing corresponding selected ones of the columns. An associative memory is coupled to the address generation circuitry for translating a first address, received from the address generation circuitry and addressing a defective one of the columns, into a second address addressing an operative ones of the columns, the second address being presented to the memory.

The principles of the present invention are also embodied in methods for working around defective rows of cells in an array of memory cells arranged in rows and columns. First, an associative memory is programmed. A first row in the array of the memory is addressed and tested to determine that the first row contains at least one defective cell. A second address is generated for addressing a second row in the array. The first and second addresses are then stored in the associative memory such that the second address is output from the associative memory upon the input of the first address. The first address is then presented to the associative memory such that the second address is output therefrom to address the memory array. The second row of the memory array is then tested to ensure that the second row is operative. Next, an address is input to the associative memory to access at least one cell of a selected row of the array. If the address to the selected row matches an address to a defective row in the array, the address of a corresponding operative row is output to the memory array.

The principles of the present invention additionally provide a method of working around columns of defective cells in an array of memory cells arranged in rows and columns. First, an associative memory is programmed. Among other things, a first column in the memory array is addressed with a first address. That first address is tested to determine that the first column contains at least one defective cell. A second address is generated for addressing a second column in the array. The first and second addresses are then stored in the associative memory such that upon the input to the associative memory of the first address, the second address is output. The first address is then presented to the associative memory such that the second address is output to allow access to the second column in the array. The second column is then tested to ensure that the second column is operative. Upon the completion of the programming steps, an address to the associative memory can then be input to access at least one cell of a selected column of the array. Then, if the address to the selected row matches an address to a defective row in the array, the address of a corresponding operative row is output from the associative memory to the memory array.

The embodiments of the present invention provide substantial advantages over the existing art. Among other things, the circuits, systems and methods of the present invention eliminate the need for expensive and time consuming physical alteration of an array of memory cells in order to replace defective rows and columns of cells. Further, the testing efficiency of an array of cells is increased since all testing is done on chip. Additionally, when the principles of the present invention are applied to devices integrating both memory circuitry and logic circuitry on a single chip, the integrated yield for the chip can be substantially increased. In this case, complete functionality of the memory portion need not always be achieved; the principles of the present invention may be applied to provide sufficient functional memory to allow the overall device to be usable, even if the memory is not completely defect free. For example, if 50% functionality of the memory can be achieved the overall device may be usable in a reduced configuration or if 90% functionality of the memory can be achieved, the overall device may fully usable. Finally, since preferably the memory array is tested with each power up of the chip, the integrity of the memory array can be maintained, even if defective cells occur well after fabrication.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts. Further, while the principles of the present invention will be illustrated within the context of a graphics/video processing system, block transfer circuits, systems and methods according to these principles may be employed in any one of a number of processing applications.

Figure 1:
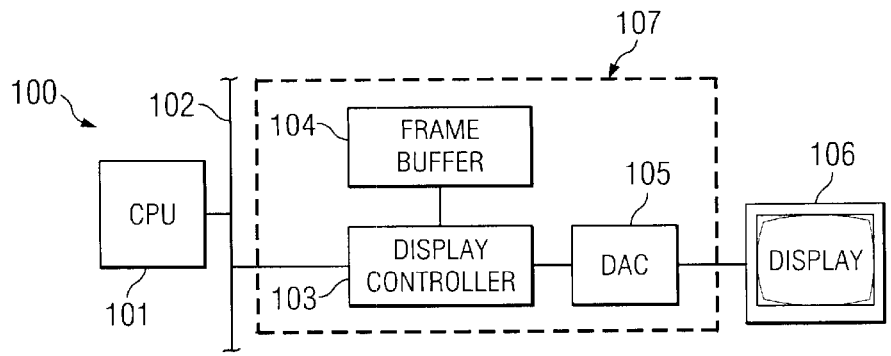
FIG. 1 is a high level functional block diagram of a graphics/video data processing system.

FIG. 1 is a high level functional block diagram of the portion of a processing system 100 controlling the display of graphics and/or video data. System 100 includes a central processing unit 101, a system bus 102, a display controller 103, a frame buffer 104, a digital-to-analog converter (DAC) 105 and a display device 106.

CPU 101 controls the overall operation of system 100, determines the content of any graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format various circuitry, and/or x- and y-zooming circuitry, to name a few options.

Display 106 may be for example a CRT unit, liquid crystal display, electroluminescent display (ELD), plasma display (PLD), or other type of display device which displays images on a display screen as a plurality of pixels.

In the illustrated embodiment, system 100 is a VGA system driving a display screen on display 106 of 640 columns by 480 rows of pixels. Also for purposes of illustration, each pixel will be assumed to be defined by 24-bits of RGB data (i.e., 8-bits each for red, green, and blue). Thus, the absolute maximum size of the physical memory of frame buffer 104 will be 640 columns by 480 rows by 24-bits per pixel or approximately one megabyte. It should be noted that the "visual pixels" on the display screen may or may not exactly map to the storage locations in the physical memory of frame buffer 104, depending on the memory formatting selected. Further, all 24-bits of color data defining each pixel may be physically stored in sequential storage locations in physical memory (in which case, all 24-bits could be stored in a given page of a DRAM or VRAM) or may be stored in three different banks or rows of the physical memory of the frame buffer 104.

Figure 2A:
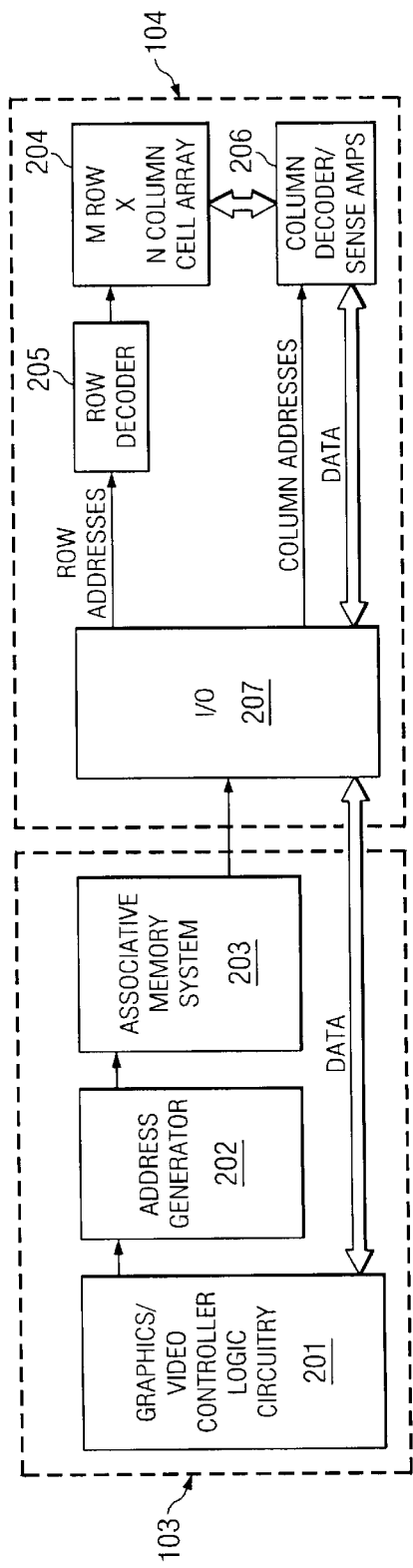
FIGS. 2A and 2B are more detailed functional block diagrams of the display controller and frame buffer depicted in FIG. 1 according to two embodiments of the present invention.

FIG. 2A is a more detailed functional block diagram of display controller 103 and frame buffer 104 emphasizing one embodiment of the circuitry implementing the principles of the present invention. As shown in FIG. 2A, display controller 103 includes graphics/video controller logic circuitry 201, address generator 202 and an associative memory system 203. Frame buffer 104 includes an array of memory cells 204 arranged in M rows and N columns. The rows of array 204 are controlled (selected) by an associated row decoder 205 and the columns of array 204 are coupled to associated column decoder/sense amplifier circuitry 206. Row decoder 205 selects a given row in array 204 during a memory access (read or write) in response to row addresses received through memory input/output circuitry 207. Similarly, the column decoders of column decoder/sense amplifier circuitry 206 allow selective access to one or more of the memory cells along a selected row in response to a column address received through input/output circuitry 207. Data is exchanged between graphics/video controller logic circuitry 201 and memory array 204 through memory input/output circuitry 207 and column decoder/sense amplifier circuitry 206.

In the illustrated embodiment, graphics/video controller logic circuitry 201 may be any one of a number of known controllers modified or programmed, as described below, which control the display of graphics and/or video data. For example, graphics/video controller logic circuitry 201 may be implemented by standard VGA controller circuitry. Similarly, address generator 202 may be any one of a number of known address generator designs which generate addresses that allow controller 201 to appropriately access storage locations within memory array 204 via row decoder 205 and column decoder/sense amplifier circuitry 206. In the preferred embodiment, a memory array 204 is an array of dynamic random access memory (DRAM) cells and the associative memory is implemented in static random access memory (SRAM) cells. Similarly, row decoder 205, column decoder/sense amplifiers 206, and input/output circuitry 207 are of a conventional design.

According to the principles of the present invention, associative memory system 203 provides for the "work around" of defective memory cells or groups of defective memory cells within array 204. As will be discussed further below, the principles of the present invention in a first embodiment allow for the substitution of an entire row of cells which contains one or more defective cells with another "spare" row of cells which is fully operational. In a second embodiment, a given column in the cell array of a "by one" memory which contains one or more defective cells can be replaced with a "spare" column of cells which contains no defective cells.

As an initial matter, it should again be recognized that typical DRAM devices include as many as ten percent more rows of cells than specified. Further, in graphics/video processing systems, such as system 100, the entire available storage space of the frame buffer memory (for example, frame buffer 104) is typically required for use as "frame buffer" (often some portion of the remaining "extra" memory space is used for the storage of other types of data required by the CPU and/or display controller). For example, a one megabyte frame buffer is typically used in a VGA system displaying data on a display screen as a "display frame" of 640 columns and 480 rows of pixels, each pixel being defined by 24-bits of data for "true color." Since this system only requires 921,600 bytes of capacity for storing each display frame, approximately ten percent of the one megabyte memory remains unused. With such a substantial amount of extra memory space available, the ability to "work around" defective memory cells or groups of cells becomes theoretically possible. Any "extra" space which can be obtained after the frame buffer space is made available can still be used for other processing operations.

In the preferred embodiment, the "frame buffer space" of array 204 is assigned to the "lower" address space. The remaining "upper" row address space is designated for defective cell "work around" purposes. It should be noted that in alternate embodiments, the designation of the frame buffer space and the work around space may correspond to different address spaces in array 204. For example, the frame buffer space may correspond to the "upper" row address space while the work around space may correspond to the "lower" row address space of array 204. In any event, the address space of array 107 may be partitioned into frame buffer space and work around space in any of a number of ways.

In the row substitution embodiment of the present invention, controller 201 includes a state machine or microcontroller which tests the rows of cells in the frame buffer space of array 204 and when a defective row is discovered, programs associative memory system 203 to map the address to the defective row in the frame buffer space to the address of an operational row in the work around space. While the testing of array 204 is preferably performed by circuitry within display controller 103, it should be recognized that in alternate embodiments this testing may be performed by test circuitry disposed within frame buffer 103. Hence, when graphics/video controller 201 attempts to access the defective row in the frame buffer space, the corresponding received address is translated by associative memory system 203 and an associated address to an operational row is output to the memory. The actual access is then made to the corresponding operational row in the work around space.

Figure 3:
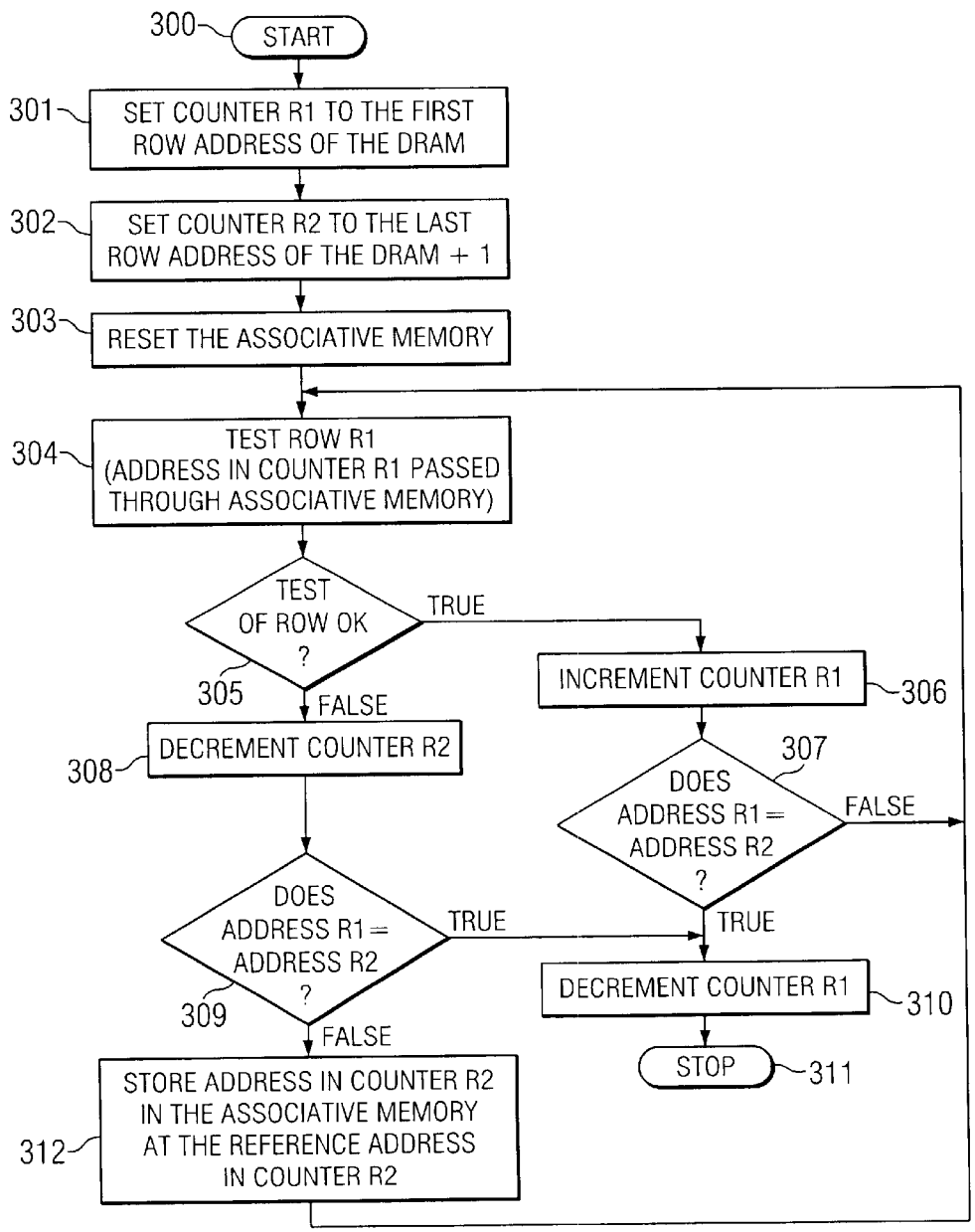
FIG. 3 is a flow chart describing the onboard programming of the associative memory system shown in FIGS. 2A and 2B to implement a defect row work around according to the principles of the present invention.

A preferred embodiment of the state machine is described in FIG. 3. The state machine operation starts at step 300 upon the power of display controller 107. Retesting of the memory array 204 and the programming of associative memory system 203 with each power up cycle allow continued maintenance of memory integrity. At step 301, the address of the first row in the frame buffer space of array 204 is loaded into a counter R1. As discussed above, in the preferred embodiment, this address is the lowest address in the address space of array 204 (i.e., address 0). At step 302, the last address to the memory array 204 (including the frame buffer space and the work around space) plus one is loaded into a second counter R2. As discussed above, in the preferred embodiment, the address loaded into counter R2 is the highest address to array 204. The associative memory system 203 is reset at step 303 such that an address presented (input) thereto is not translated and is simply passed through.

At step 304, a test of the cells of the addressed row is initiated. Step 304 may be implemented for example by performing a conventional row test in which graphics/video controller 201 writes a pattern of data into the addressed row using row decoder 205 and column decoders 206, reads the pattern back from the addressed row using row decoder 205 and column decoder/sense amplifier circuitry 206, and then compares the data read back with the data originally written in to the address row. It should be noted that the row address to array 204 is passed through associative memory system 203, although since no association has been made no translation occurs. If the tested row of the frame buffer space is good then at step 306 the address in counter R1 is incremented. Next, a test is performed at step 306 to determine if the end of the available frame buffer space has been reached. In the preferred embodiment, a comparison is made of the addresses in counters R1 and R2; when the two addresses are equal, the frame buffer space and the work around space have reached each other and no further memory space is available for either purpose. If the end of the available frame buffer space has in fact been reached, then at step 310 the address in counter R1 is decremented and at step 311 testing programming process is complete. If however at step 307 a determination is made that the end of the available frame buffer space has not been reached, then the process continues at step 304 where the new row now addressed by the address in counter R1 is tested for defective cells. The process continues as described above at step 305.

If a row containing one or more defective cells is detected at step 305, then at step 308 the count in counter R2 is decremented (since the initial count loaded into counter R2 is the highest available address plus one, on the initial performance of step 308, the address in counter R2 is decremented to the highest address available to array 204). At step 309, a test is performed to determine if work around space is available. In the preferred embodiment the counts in R1 and R2 are again compared. If the counts are equal then the available space in memory has been consumed and the processing again proceeds to steps 310 and 311.

If at step 309, the count (address) in counter R1 does not equal the count (address) in counter R2, then at step 312 the associative memory system is programmed to associate the address in counter R1 with the address in counter R2 (i.e., such that the input of the address in R1 results in the output of the address in counter R2).

After the programming step 312, the address in counter R1 is again presented to associative memory 203 such that the row addressed by the associated address output from associative memory 203 can itself be tested at step 304. The testing continues at step 305 until the address in counter R1 is associated with the address to an operative row in array 204, at which time processing moves to the next row at step 306, or until the entire available memory space has been used at step 311.

Once associative memory system 203 has been programmed, graphics/video controller 201 is ready to process graphics or video data in a conventional manner. Whenever controller 201 (and associated address generator) generates an address which attempts to access a defective row in the frame buffer space of array 204, a match occurs in associative memory system 203 and that address is substituted with the address of the corresponding row in the work around space.

Figure 2B:
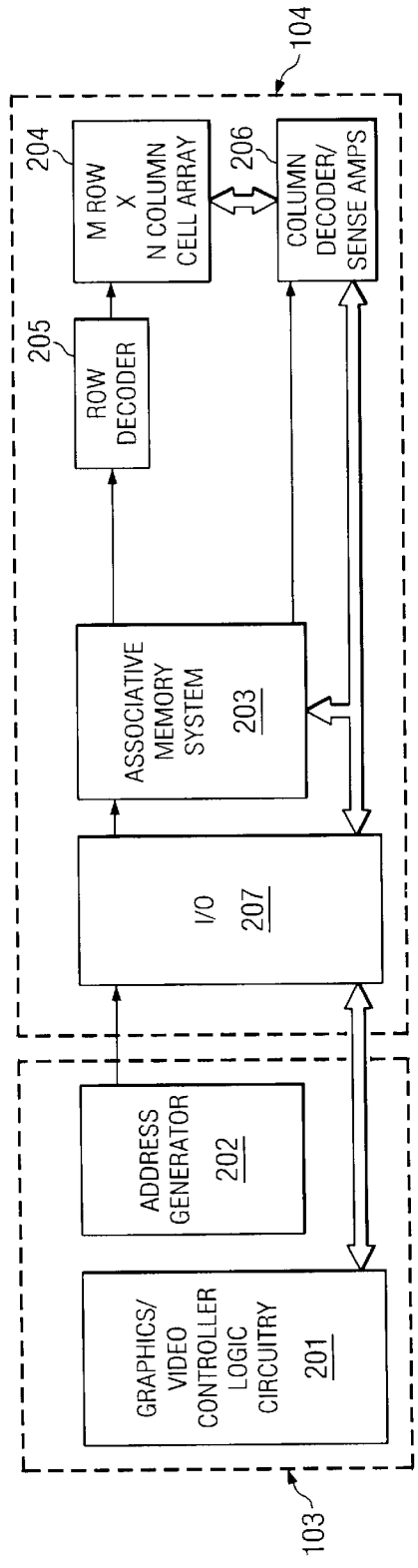

FIG. 2B depicts an alternate embodiment of the present invention. In the system shown in FIG. 2B, the associative memory system 203 is implemented within the frame buffer system 104 rather than within display controller 103. As one alternative, the circuitry required to test array 204 may be also be disposed within frame buffer 204, for example as part of associative memory system 203 itself. As another alternative, the testing of array 204 is performed by circuitry within controller 103, as was discussed above. The embodiment of FIG. 2B has advantages over the embodiment of FIG. 2A. In the embodiment of FIG. 2A, graphics/video controller 201 an address generator 202, must be capable of generating enough address bits to not only address the frame buffer space required for conventional processing operations but also of generating additional address bits to provide access to the work around space of the memory array 204. In the embodiment of FIG. 2B where the test circuitry is disposed within associative memory system 203, the test of memory array 204 is performed and the associative memory programmed without the intervention of the controller 201. Any necessary additional address bits are generated within associative memory. Therefore, controller 201 need only continue to generate the number of row address bits originally required to access the frame buffer space. It should be noted that in this case each address from the controller 201 may map to a longer address word when a work around is being performed.

Figure 4:
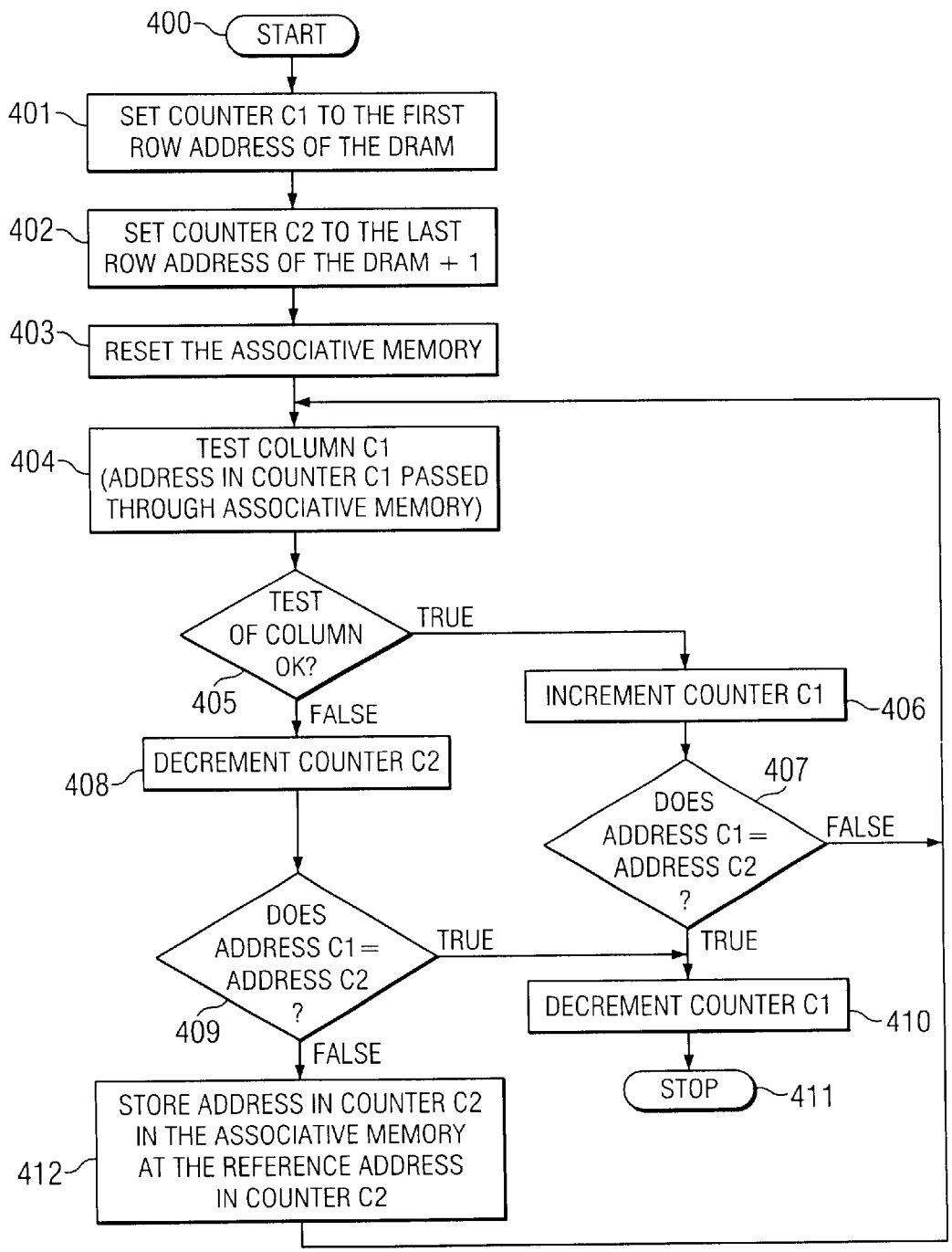
FIG. 4 is a flow chart describing the onboard programming of the associative memory system shown in FIGS. 2A and 2B to implement a defective column work around according to the principles of the present invention.

The principles of the present invention are also applicable to work around defective columns of memory cells in array 204. In this case, a microprocessor or microcontroller operable to perform conventional column and/or row tests is preferably provided within either graphics/video controller 201 in the embodiment of FIG. 2A or in the associative memory system/memory test circuitry 203 of the embodiment of FIG. 2B. In the case of column test, any unused or redundant columns provided in memory array 204 are used to work around bad columns in the frame buffer space by passing each column address through the associative memory system 203. The associative memory programming procedure is similar to that of FIG. 3 and is shown in FIG. 4.

Although the present invention and its advantages have been described in detail, it should be understood that various changes, substitutions and alterations can be made herein without departing from the spirit and scope of the invention as defined by the appended claims.

What is claimed is:

1. A data processing system comprising:
   a memory array comprising a plurality of rows and columns of memory cells;
   a row address decoder for selecting a row of cells for access in response to a row address;
   address generation circuitry for generating row addresses for accessing corresponding rows of cells, each said address comprising a plurality of address bits; and
   a reprogrammable associative memory for:
      modifying an address received from said address generation circuitry and addressing a defective row of cells to obtain a new address addressing an operable one of said rows, substantially the entirety of said new address being passed from said associative memory to said row address decoder; and
      passing a said address received from said address generation circuitry and addressing an operative one of said rows to said row address decoder unmodified.

2. The system of claim 1 wherein said operative row is in a second space in said array and defective row in first space in said array.

3. The system of claim 2 wherein said first space comprises a frame buffer space within said array.

4. The system of claim 1 and further comprising programming circuitry for programming said associative memory, said programming circuitry operable to:
   address a first said row in said array with said first address;
   test said first row to determine said first row contains at least one defective said cell;
   generate said second address;
   program said associative memory to output said second address upon the input of said first address;

present said first address to said associative memory system;

address a second said row in said array with said second address output from said associative memory in response to the presentation of said first address; and test said second row to insure that said second row is operative.

5. The system of claim 4 wherein said programming circuitry comprises a state machine.

6. The system of claim 4 wherein said programming circuitry comprises a microcontroller.

7. A data processing system comprising:

a controller including address generation circuitry for generating addresses to access an associated memory;

a memory system including an array of memory cells arranged in rows and columns and decoding circuitry for selecting ones of said rows and columns in response to received ones of said addresses; and reprogrammable associative memory circuitry operable to translate addresses received from said controller and addressing defective ones of said rows in a first space in said array into new addresses addressing corresponding operative ones of said rows in a second space in said array, substantially all bits of each of said new addresses passed from said associative memory to said decoding circuitry, and wherein said associative memory is further operable to pass unmodified substantially all bits of each address received from said controller and addressing operative ones of said rows in said first space to said decoding circuitry.

8. The processing system of claim 7 wherein said controller comprises a display controller.

9. The processing system of claim 7 wherein said controller comprises a VGA controller.

10. The processing system of claim 7 wherein said controller includes circuitry operable to program said associative memory circuitry to implement a said translation.

11. The processing system of claim 10 wherein said controller is operable to:

load an address to a first said row into a first counter;

load an address to a second said row into a second counter;

access and test said first row for defective cells;

if said first row does not contain any defective cells, increment said first counter to obtain a first new address;

if said first row contains at least one defective cell:
  decrement said second counter to obtain a second new address;
  program said associative memory system to output said second new address upon input of said first address;
  present said first address to said associative memory system;
  address a second said row in said array with said second new address output from said associative memory in response to the presentation of said first address; and
  test said second row to insure that said second row is operative.

12. The processing system of claim 10 wherein said controller is operable to:

access and test a said first row for defective cells in response to a first address, said first address held in a first counter;

if said first row does not contain any defective cells:
  increment said first address in said first counter to obtain a first new address;
  if said first new address is equal to an address held in a second counter, decrement said first counter to obtain said first address and stop; and
  if said first new address is not equal to said address in said second counter, test a said row corresponding to said first new address for defective cells; and if said first row contains at least one defective cell:
  decrement said second counter to obtain a second new address;
  if said second new address is equal to said address in said first counter, decrement said first counter to obtain said first address and stop; and
  if said second new address is not equal to said address in said first counter:
    program said associative memory system to output said second new address upon input of said first address;
    present said first address to said associative memory system;
    address a second said row in said array with said second new address output from said associative memory in response to the presentation of said first address; and
    test said second row to insure that said second row is operative.

13. The processing system of claim 7 wherein said memory system includes programming circuitry operable to program said associative memory circuitry to implement a said translation.

14. The processing system of claim 13 wherein said programming circuitry is operable to:

load an address to a first said row into a first said counter;

load an address to a second said row into a second said counter;

access and test said first row for defective cells;

if said first row does not contain any defective cells, increment said first counter to obtain a first new address;

if said first row contains at least one defective cell:
  decrement said second counter to obtain a second new address;
  program said associative memory system to output said second new address upon input of said first address;
  present said first address to said associative memory system;
  address a second said row in said array with said second new address output from said associative memory in response to the presentation of said first address; and
  test said second row to insure that said second row is operative.

15. A processing system comprising:

a memory including an array of memory cells arranged in rows and columns:

a column address decoder for selecting a said column for access in response to a column address;

address generation circuitry for generating ones of said addresses for accessing corresponding ones of said columns; and a reprogrammable associative memory coupled to said address generation circuitry for translating a first said address, received from said address generation circuitry and addressing a defective one of said columns, into a second said address addressing an operative one of said columns, substantially all bits of said second address passed from said associative memory to said decoder, and said associative decoder passing unmodified substantially all of each address received from said controller and addressing operative ones of said rows to said decoding circuitry.

16. The processing system of claim 15 and further comprising programming circuitry for programming said associative memory to implement said translation.

17. The processing system of claim 16 wherein said programming circuitry is operable to:
load an address to a first said column into a first counter;
load an address to a second said column into a second counter;
access and test said first column for defective cells;
if said first column does not contain any defective cells, increment said first counter to obtain a first new address;
if said first column contains at least one defective cell:
decrement said second counter to obtain a second new address;
program said associative memory system to output said second new address upon input of said first address;
present said first address to said associative memory system;
address a second said column in said array with said second new address output from said associative memory in response to the presentation of said first address; and
test said second column to insure that said second column is operative.

18. The processing system of claim 16 wherein said programming circuitry is operable to:
access and test a said first column for defective cells in response to a first address, said first address held in a first counter;
if said first column does not contain any defective cells:
increment said first address in said first counter to obtain a first new address;
if said first new address is equal to an address held in a second counter, decrement said first counter to obtain said first address and stop; and
if said first new address is not equal to said address in said second counter, test a said column corresponding to said first new address for defective cells; and
if said first column contains at least one defective cell:
decrement said second counter to obtain a second new address;
if said second new address is equal to said address in said first counter, decrement said first counter to obtain said first address and stop; and
if said second new address is not equal to said address in said first counter:
program said associative memory system to output said second new address upon input of said first address;
present said first address to said associative memory system;
address a second said column in said array with said second new address output from said associative memory in response to the presentation of said first address; and
test said second column to insure that said second column is operative.

19. The system of claim 15 wherein said associative memory system comprises a static random access memory.

20. A method for working around defective cells in an array of memory cells arranged in rows and columns, comprising the steps of:
programming a reprogrammable associative memory, said step of programming comprising the substeps of:
addressing a first row in the array with a first address;
testing the first row and to determine that the first row contains at least one defective cell;
determining the availability of a second operative row in the array;
generating a second address to the second row in the array;
storing the first and second addresses in the associative memory such that the second address is output upon the input of the first address;
presenting the first address to the associative memory;
addressing the second row in the array with the second address output from the associative memory in response to the presentation of the first address; and
testing the second row to insure that the second row is operative;
inputting an address to the associative memory to access at least one cell of a selected row of the array; and
if the address to the selected row matches an address to a defective row in the array, output to the memory the address of a corresponding operative row.

21. The method of claim 20 wherein said step of programming further comprises the substep of comparing the first and second addresses prior to said substep of storing to determine if memory space is available for working around.

22. A method of working around defective cells in an array of memory cells arranged in rows and columns, comprising the steps of:
programming a reprogrammable associative memory, said step of programming comprising the substeps of:
addressing a first column in said array with a first address;
testing the first column to determine that the first column contains at least one defective cell;
determining the availability of a second operative column in the array;
generating a second address to the second column in the array;
storing the first and second addresses in the associative memory such that the second address is output upon the input of the first address;
presenting the first address to the associative memory;
addressing the second column in the array with the second address output from the associative memory in response to the presentation of the first address; and
testing the second column to insure that the second column is operative;
inputting an address to the associative memory to access at least one cell of a selected column of the array; and
if the address to the selected row matches an address to a defective row in the array, output from the associative memory the address of a corresponding operative row.

23. The method of claim 22 wherein said step of programming further comprises the substep of comparing the first and second addresses prior to said substep of storing to determine if memory space is available for working around.

* * * * *